(12) United States Patent
Somasekhar et al.

(10) Patent No.: US 6,879,531 B2
(45) Date of Patent: Apr. 12, 2005

(54) REDUCED READ DELAY FOR SINGLE-ENDED SENSING

(75) Inventors: Dinesh Somasekhar, Hillsboro, OR (US); Yibin Ye, Portland, OR (US); Fatih Hamzaoglu, Hillsboro, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 217 days.

(21) Appl. No.: 10/324,177

(22) Filed: Dec. 19, 2002

(65) Prior Publication Data

US 2004/0120199 A1 Jun. 24, 2004

(51) Int. Cl.$^7$ ............................. G11C 7/00; G11C 11/00
(52) U.S. Cl. ...................... 365/203; 365/154; 365/156
(58) Field of Search ................................ 365/203, 205, 365/207, 208, 154, 156

(56) References Cited

U.S. PATENT DOCUMENTS

| | | | | |
|---|---|---|---|---|
| 6,519,176 B1 | * | 2/2003 | Hamzaoglu et al. | 365/203 |
| 6,724,649 B1 | * | 4/2004 | Ye et al. | 365/203 |
| 6,731,566 B1 | * | 5/2004 | Sywyk et al. | 365/154 |
| 6,738,306 B2 | * | 5/2004 | McLaury | 365/154 |

* cited by examiner

Primary Examiner—Trong Phan
(74) Attorney, Agent, or Firm—John F. Travis (57) ABSTRACT

An offset line to substantially cancel the capacitive coupling effects of a select line to a memory cell. When the select line transitions to cause a stored memory state in the memory cell to be placed onto a sense line, capacitive coupling from the select line to the sense line is substantially cancelled by capacitive coupling, of an opposite polarity, from an offset line to the sense line. Without the opposing effects of the offset line, the capacitive coupling from the select line would raise the pre-charge voltage level on the sense line, which would then require a longer time to discharge down to the input threshold of a sense gate that detects the stored state that was in the memory cell.

25 Claims, 5 Drawing Sheets

REDUCED READ DELAY FOR SINGLE-ENDED SENSING

BACKGROUND

1. Field of the Technology

The present invention relates generally to the field of integrated circuits. More particularly, the present invention relates to the field of signal sensing in memory circuits.

2. Description of the Related Art

A static random access memory (SRAM) is generally implemented as an array of memory cells arranged electrically as a matrix of rows and columns, with a memory cell at each row/column intersection. Each memory cell stores a bit. A column of memory cells is prepared for a read operation by pre-charging the line connecting all cells in that column (e.g., a bit line) to a predetermined level. A selected memory cell is read by activating a line connecting all the memory cells in that row. The selected memory cell is read when the activated word line turns on an access transistor connecting the memory cell to the pre-charged bit line. Depending on the binary state stored in the memory cell, the memory cell will either discharge the bit line through the access transistor (if the stored binary state is low), or will leave the bit line charged (if the stored binary state is high). A sense gate (e.g., a logic gate such as a NAND gate) whose input is connected to the bit line is used to sense the detected state. If the bit line remains charged, the input of the logic gate remains unchanged, as does its output. However, if the bit line is discharged, when the voltage level on the bit line drops below the input threshold of the sense gate, the output of the sense gate will change (the input threshold is the voltage at the gate's input that causes the gate's output to transition). The state of the output of the sense gate indicates the binary state that was stored in the selected cell. Depending on the organization of the array, multiple cells on a row may be read at the same time when their common word line is activated, first by pre-charging all their respective bit lines and then by sensing their individual effect on their associated bit lines through individual sense gates. The amount of time that it takes for a bit line to discharge down to the input threshold of the sense gate is a limiting factor on how quickly a bit cell may be read, and therefore a limiting factor on the speed of the memory device.

Due to the close proximity of a word line and a bit line at the point where they cross each other in the matrix pattern, when a word line is activated by quickly raising the voltage on the word line from low to high, a portion of this rapidly increasing voltage on the word line may be capacitively coupled through to the bit line, thereby temporarily raising the voltage seen on the bit line. This in effect increases the pre-charged level of the bit line. An immediately subsequent discharge of the bit line (e.g., during a read operation) must therefore start from a higher initial voltage, requiring a longer time to discharge down to the input threshold of the sense gate. This discharge time limits the minimum time required for a read operation, which limits the maximum speed at which the memory may operate. Thus the use of a word line to activate the reading of a memory cell may inadvertently cause the read operation to take more time and negatively impact overall memory speed. One approach to resolving this problem is to configure the bit line as a differential pair (two bit lines per column, the stored state is indicated by which one discharges), so that the coupled increase is seen as a common mode voltage and does not affect the sensing speed. However, this requires extra circuitry, which increases manufacturing costs and circuit complexity and limits the amount of memory that may be placed into a given physical area.

BRIEF DESCRIPTION OF THE DRAWINGS

Embodiments of the invention are illustrated by way of example and not limitation in the figures of the accompanying drawings, in which like references indicate similar elements and in which.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "example embodiment", "various embodiments", etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, the term 'connected', or its derivatives, refer to a direct physical or electrical relationship between the indicated elements, while the term 'coupled', or its derivatives, is broader, referring to a either a direct or indirect physical, electrical, capacitive, inductive, or electromagnetic relationship between the indicated elements.

Embodiments of the invention may reduce delay in reading a value from a memory cell with a single-ended sensing arrangement by using capacitive coupling from an offset line to a sense line to effectively cancel out the capacitive coupling from a selection line to the sense line, the offset line being switched in the opposite direction as the selection line. Portions of the following description refer to a matrix of memory cells, with rows and columns of lines to address those memory cells. Each memory cell is connected to a sense line that is pre-charged to a certain voltage before reading the memory cell, and to a select line that is activated to trigger a read of the memory cell. In the described embodiments, the sense lines are shown as the column lines and the select lines are shown as the row lines, but other embodiments may use a different orientation. In keeping with common convention, in the described embodiments the sense lines are frequently referred to as bit lines and the select lines are frequently referred to as word lines, but other embodiments may use other designations (e.g., in some embodiments the terms may be reversed or other terms may be used to describe the relevant matrix of lines).

Figure 1:
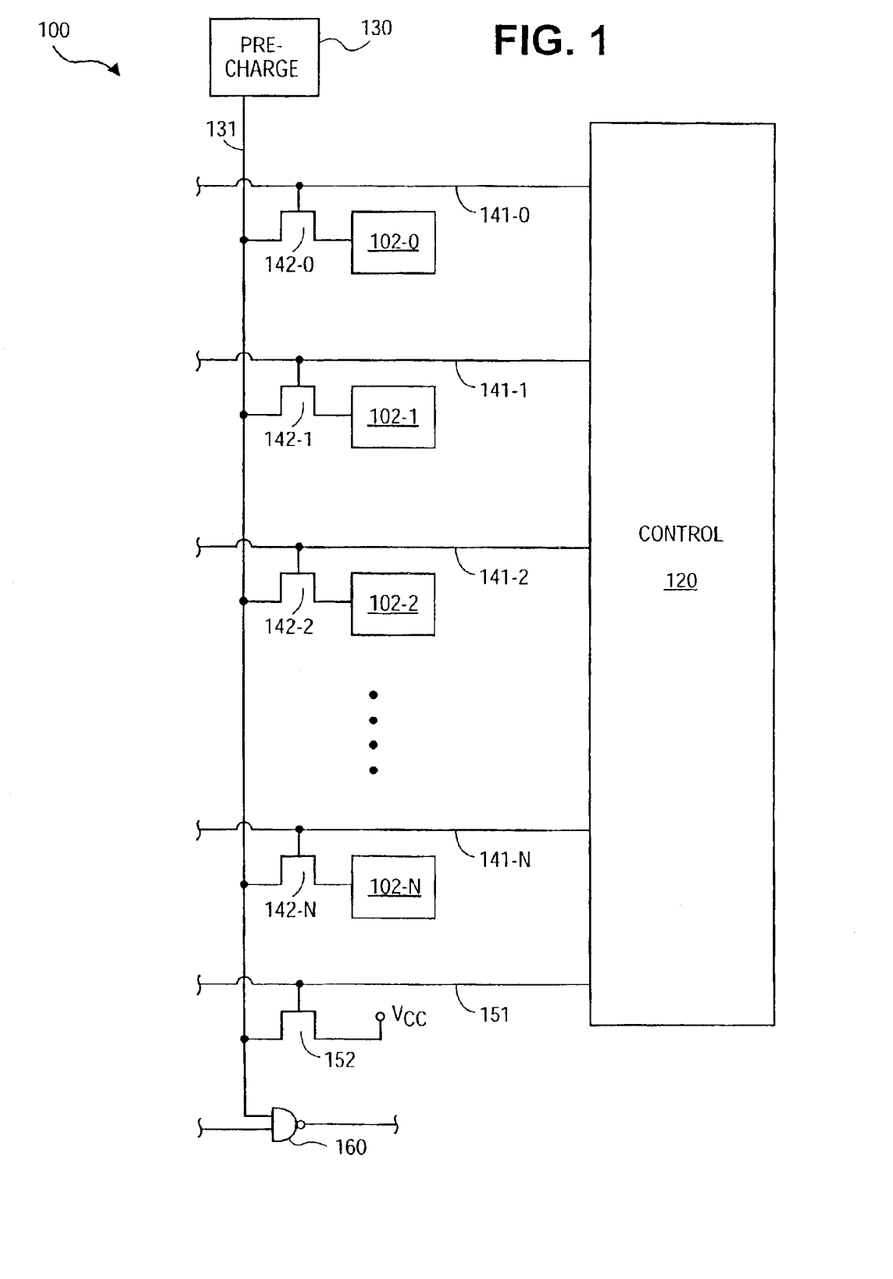
FIG. 1 shows a logic diagram of a column of memory cells and associated select lines, according to one embodiment of the invention.

FIG. 1 illustrates one column of a portion of a memory circuit, according to one embodiment of the invention. In some embodiments the memory circuit is an SRAM, but other embodiments may use other types of memory (e.g., any type of memory that uses a particular stored state to discharge a sense line during a read operation). In the illustrated embodiment of FIG. 1, circuit 100 includes a single column of memory cells, with each memory cell having a storage cell (labeled 102-0 through 102-N) and an associated access transistor (labeled 142-0 through 142-N). Circuit 100 may be implemented in any feasible device, using any feasible circuit technology and any feasible manufacturing process.

Each access transistor 142-x connects the associated storage cell to a common bit line 131. (Note: the format YYY-x is used herein to denote any of multiple numbered devices YYY.) In the illustrated embodiment, bit line 131 uses a single-ended sensing arrangement, i.e., the voltage on bit line 131 is measured with reference to a constant voltage reference such as signal ground, rather than to an opposing line that also has a switchable voltage on it.

Each access transistor 142-x has a gate connected to an associated word line (labeled 141-0 through 141-N) that may be controlled by control logic 120. An offset line 151 may also be controlled by control logic 120, and the offset line 151 is connected by offset transistor 152 to bit line 131. When used as an adjective, the term 'offset' is used herein because the described objects may be used to offset, or effectively cancel out, capacitive coupling from the word line by creating capacitive coupling in the opposite direction, but the adjective 'offset' should only be read as an identifying label and not as a limitation. Sense gate 160 (a logic element comprising one or more transistors, not to be confused with the gate of an MOS transistor) may be used to sense the state of a selected storage cell 102-x by sensing whether bit line 131 discharges after the associated word line has been activated. Sense gate 160 is shown with two inputs, with one of the inputs connected to bit line 131. The other may be connected to another bit line (not shown) which may sense another column of memory cells (also not shown). Sense gate 160 may be coupled to 2, 3, or more bit lines in this manner, so that a single sense gate can serve multiple columns of memory cells. However, only one of the columns may be read at a time by a single sense gate of this configuration. Although a NAND gate is shown for sense gate 160, other types of logic gates may also be used as sense gates (e.g., an AND gate, an inverter for a single-line sensing, a combination of gates, etc.).

Each word line 141-x may also connect to the access transistors of other columns of memory cells (not shown) in a manner similar to the connections to the illustrated column of memo cells. For example, word line 141-0 may be simultaneously connected to access transistor 142-0 of storage cell 102-0 in each of multiple columns, so that the gates of all the access transistors in row 0 will receive the same signal from word line 141-0 at essentially the same time. In a similar manner, each column may have storage cell 102-1 connected through an access transistor 142-1 to word line 141-1, a storage cell 102-2 connected through an access transistor 142-2 to word line 141-2, etc.

In addition to the word lines 141-0 through 141-N, control logic 120 may also control an offset line 151. An offset transistor 152 may be coupled to bit line 131 and also have a gate connected to offset line 151. However, rather than being coupled to a storage cell, offset transistor 152 may be coupled to a high signal level (e.g., Vcc). As with the other word lines, offset line 151 may also be connected to other offset transistors, equivalent to offset transistor 152, for other columns. The illustrated embodiment shows a single offset transistor connecting offset line 151 to each bit line, but other embodiments may use other quantities of offset transistors per bit line (e.g., 2, 3, or more offset transistors per bit line).

In one embodiment access transistors 142-x and offset transistor 152 are NMOS transistors, but other embodiments may differ (e.g., both may be PMOS transistors, 142-x and 152 may not be the same type of transistors, etc.).

The illustrated embodiment shows sense gate 160 to be at the opposite end of bit line 131 from pre-charge logic 130, but other embodiments may place sense gate 160 in other locations on bit line 131 (e.g., at the same end as pre-charge logic 130, in between any two of access transistors 142-x, etc.).

The illustrated embodiment shows offset transistor 152 to be at the opposite end of bit line 131 from pre-charge logic 130, but other embodiments may place offset transistor 152 in other locations on bit line 131 (e.g., at the same end as pre-charge logic 130, in between any two of access transistors 142-x, etc.). In embodiments that include multiple offset lines for a single bit line, the offset transistors may be distributed on bit line 131 in various ways (e.g., an access transistor at each end, an access transistor at each end and another one in the middle, etc.).

In operation, bit line 131 may be initially pre-charged to a level suitable for a read operation on a selected one of the storage cells 102-x in the column. In one embodiment, bit line 131 is charged to Vcc, but other embodiments may use other pre-charge voltages. Subsequently, one of word lines 141-x may be activated to read the selected memory cell that is at the intersection of the activated word line and the bit line. Only one of word lines 141-x is activated for a single read operation, since activating two simultaneously would cause two memory cells to place their stored state on the single bit line 131 at the same time, with one possibly interfering with the other. As stated before, when the selected word line is activated by driving the signal on that word line high, the quick rise time on the word line may have a capacitive coupling affect on the crossing bit line 131, causing the voltage on the bit line 131 to temporarily rise to a higher level. To substantially cancel this effect, when the selected word line is driven from low to high, the offset line 151 may be driven from high to low. Since the offset line 151 may have the same physical relationship to the bit line 131 as the other word lines, the changing signal on the offset line 151 may also be coupled onto the bit line 131. However, since the signal on the offset line is dropping rapidly, the coupling effect may be to temporarily drop the voltage on the bit line 131. This voltage-dropping coupling effect may fully or partially cancel out the voltage-increasing coupling effect of the selected word line. In one embodiment, 'fully cancel' may also include over-correcting, so that the voltage-dropping coupling effect from the offset line may exceed the voltage-increasing coupling effect from the select line. To prevent offset transistor 152 from ever pulling down bit line 131, offset transistor 152 may be coupled to a high signal level, so that offset transistor 152 will not pull down the voltage on bit line 131 even when offset transistor 152 is turned on. To prevent the offset transistor 152 from interfering with the load on the bit line 131 during discharge, the offset transistor 152 may be turned on during pre-charge of the bit line and turned off during discharge of the bit line.

Because the bit line 131 may have various physical lengths and various numbers of access transistors 142-x coupled to it, the effect of a single offset line 151 may or may not be sufficient to substantially cancel the coupling effect of every word line. For this reason, some embodiments may have multiple offset lines 151, spaced at intervals along the bit line 131, with each offset line being used only for certain word lines that are close enough for the word line coupling effect to be substantially canceled out.

Figure 2:
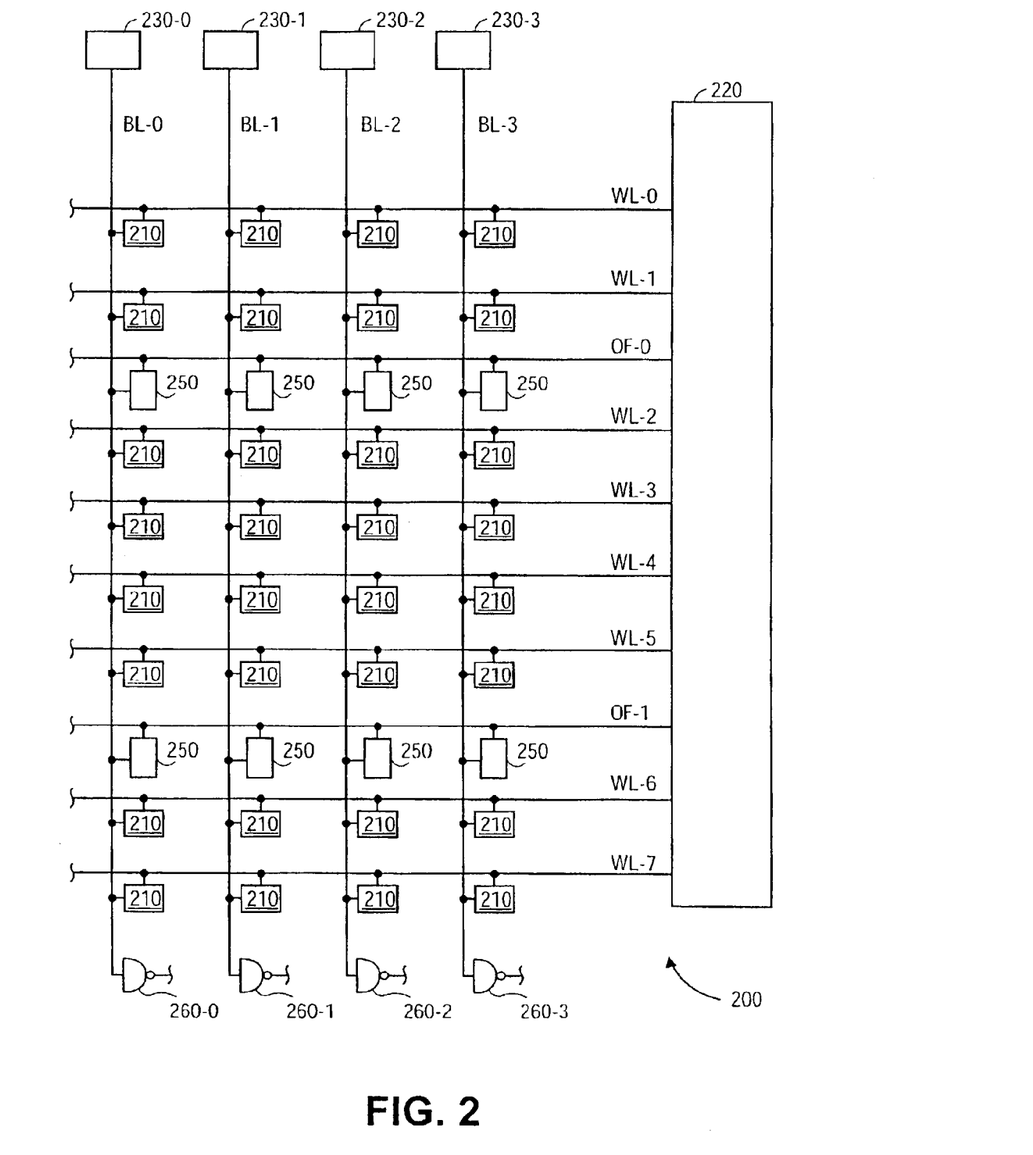
FIG. 2 shows a matrix of memory cells and associated select lines, according to one embodiment of the invention.

FIG. 2 shows an embodiment of a portion 200 of a memory comprising a matrix of memory cells, with multiple bit lines BL-x, multiple word lines WL-x, and multiple offset lines OF-x. Each bit line has pre-charge logic 230-x and a sense gate 260-x. Also shown are memory cells 210, each comprising both a storage cell and an access transistor, with the access transistor coupled to both the adjacent bit line and the adjacent word line. Offset transistors 250 are shown coupled to the adjacent bit line and the adjacent offset line. Each offset transistor 250 may also be internally connected to a reference voltage, as previously described for offset transistor 152 in FIG. 1. The illustrated embodiment shows four bit lines, eight word lines, and two offset lines, but other embodiments may include other quantities and many embodiments may include larger quantities. The embodiment of FIG. 2 has two offset lines, placed so that no select line is more than two rows away from an associated offset line. In this manner, the coupling effect of a selected word line and the coupling effect of the associated offset line will be in close proximity to one another, allowing for a close match of their opposing coupling effects. These relative quantities are for illustration only—in most embodiments the number of word lines and bit lines may be significantly greater than shown, and the number of word lines per offset line may be significantly greater than the 2-1 ratio of FIG. 2. In some embodiments, a single offset line may be sufficient for all the word lines that are coupled to a common bit line.

Figure 3:
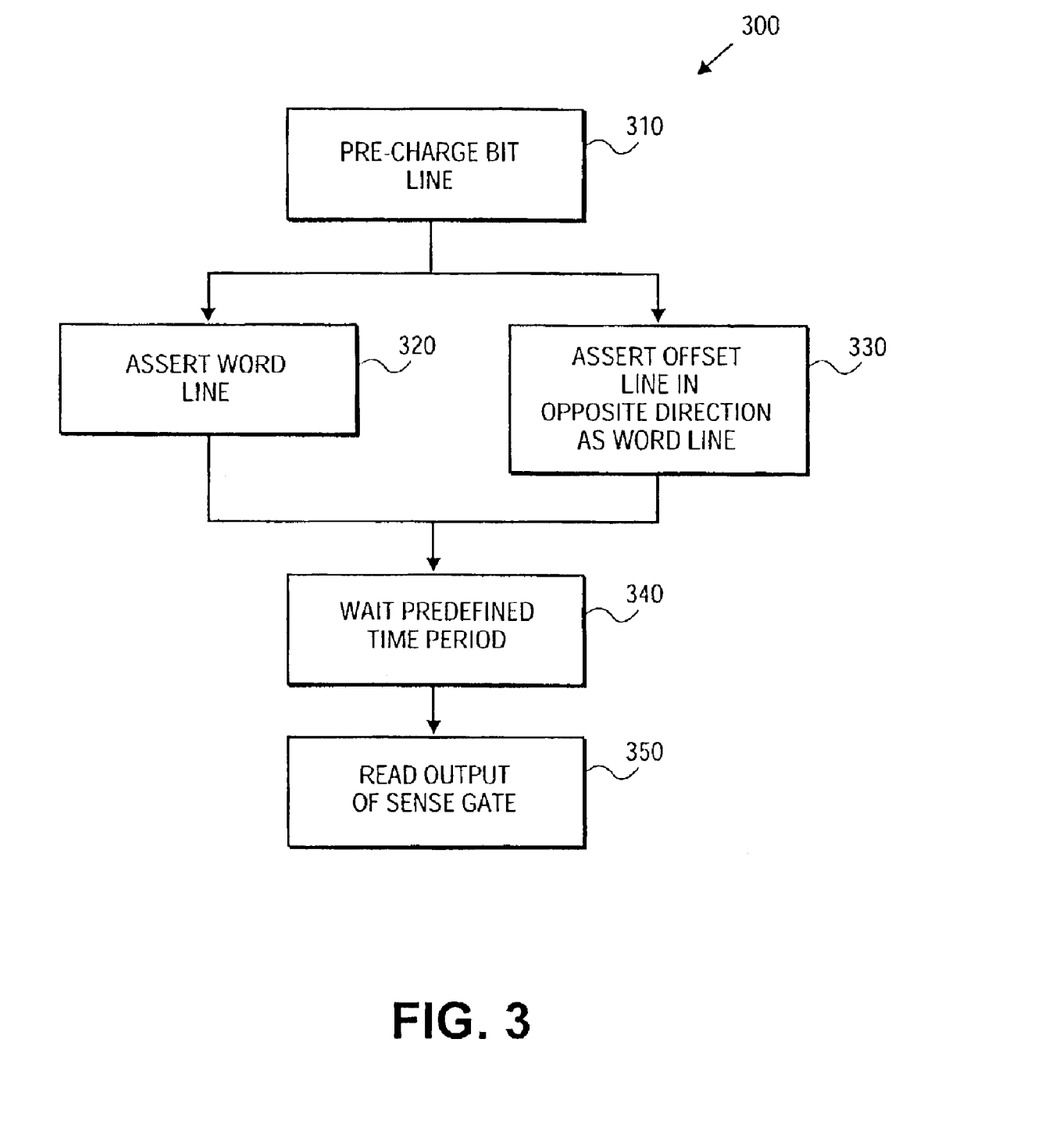
FIG. 3 shows a flow chart of a method, according to one embodiment of the invention.

FIG. 3 shows a flow chart of a method of operation, according to one embodiment of the invention. In flow chart 300, at 310 a bit line (e.g., bit line 131 in FIG. 1) is pre-charged by placing a voltage on the bit line. In one embodiment the bit line is pre-charged to Vcc, but other embodiments may pre-charge to other voltage levels. With reference to FIG. 1, pre-charge logic 130 may comprise a transistor to connect the bit line to Vcc or other suitable voltage. In one embodiment multiple bit lines may be simultaneously pre-charged so that multiple bit lines may subsequently be simultaneously read.

At 320 a selected word line is asserted (e.g., word line 141-2 in FIG. 1). At the same time as the word line is asserted, at 330 an offset line (e.g., offset line 151 in FIG. 1) is deasserted by being driven in the opposite direction as the selected word line. (Note: within the context of this disclosure, the term "asserted" indicates driving a signal from a first binary state to a second binary state, for example from low to high, while the term "deasserted" indicates driving a signal from the second binary state to the first binary state, for example from high to low. These terms might be interpreted differently outside this disclosure.) The coupling effect of the word line on the pre-charged bit line and the opposing coupling effect of the offset line on the same pre-charged bit line may fully or partially cancel each other, so that the voltage level on the pre-charged bit-line is not increased by as much as it would be without the effects of the offset line. Due to the opposing coupling effect of the offset line, the voltage level on the pre-charged bit line may be increased only slightly, may not change at all from the pre-charged level, or may decrease slightly, as a result of the opposing coupling effects of the word line and offset line.

At 340 and 350, the output of the sense gate (e.g., sense gate 160 in FIG. 1) on the bit line is read after a predetermined time period. This time period is to allow a discharging bit line sufficient time to discharge below the input threshold of the sense gate. The predetermined time period may be established by the frequency of a clock circuit that drives portions of the memory circuit. The predetermined time period may have various values, depending on the particular circuits and technologies used, but may be shorter than it would be without the effect of the offset line. In one embodiment the predetermined time period is in the range of a few tens of nanoseconds (e.g., 50 nanoseconds).

Figure 4:
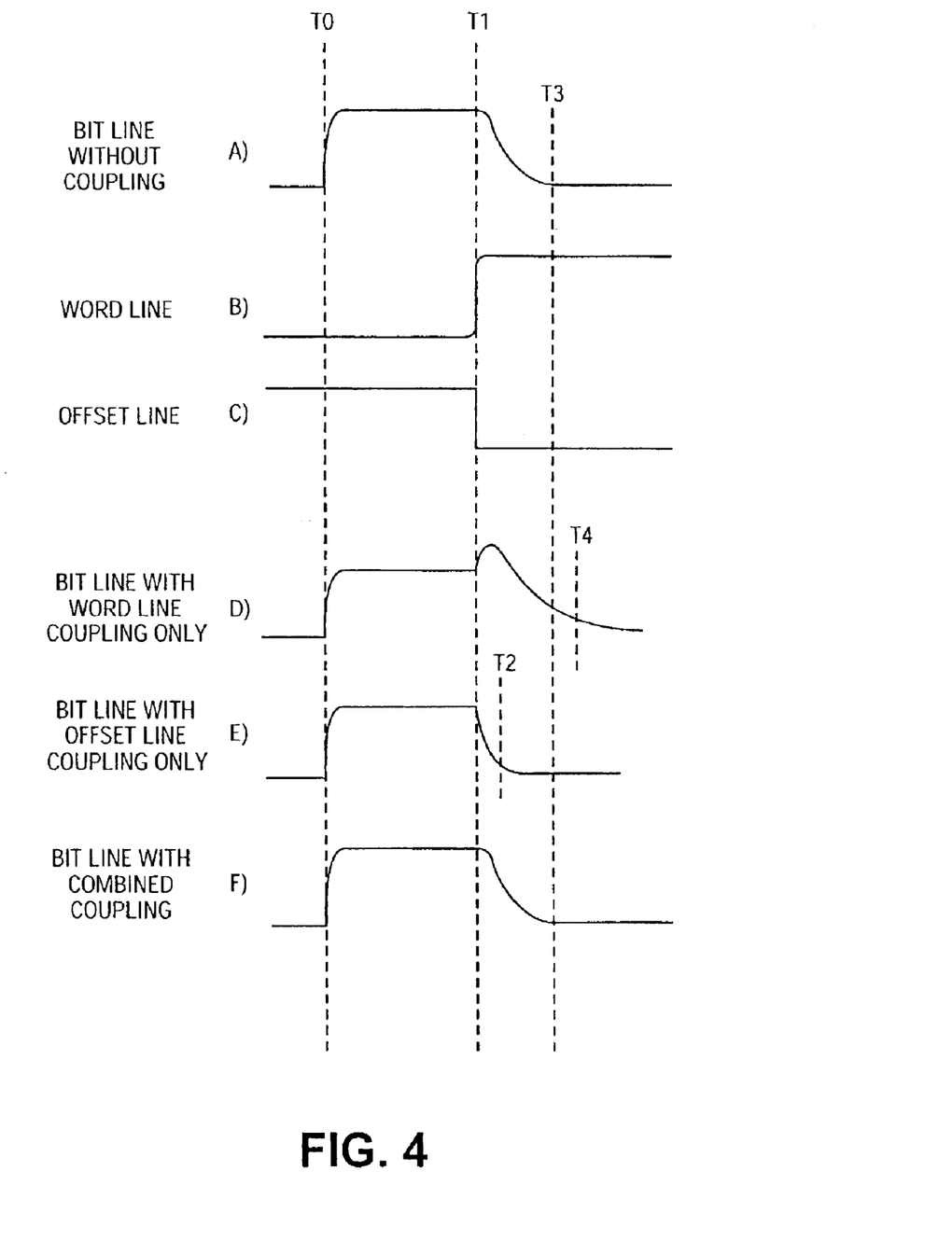
FIG. 4 shows a timing diagram of a read operation, according to one embodiment of the invention.

FIG. 4 shows a timing diagram for a read operation. Graph A) shows the theoretical voltage on a bit line if there were no coupling effects from any word line or offset line. At time T0, a pre-charge phase is initiated by placing the pre-charge voltage on the bit line. The leading edge of the pre-charge is shown slightly rounded to account for the finite time required to place the pre-charge voltage over the entire length of the bit line. However, for the purposes of this illustration the amount of time to accomplish the pre-charge operation is not important so long as it is less than the time interval from T0 to T1. At time T1, when a selected word line is asserted and the associated access transistor is turned on, the bit line may be discharged through the access transistor if the portion of the storage cell connected to the access transistor is low (e.g., at signal ground). At time T3, the voltage on the discharging bit line reaches the input threshold of the sense gate, thus changing the state of the output of the sense gate. At any time after T3, the output of the sense gate may be reliably read to determine the binary state of the selected storage cell. The indicated discharge of the bit line after time T1 assumes a particular binary state is stored in the storage cell. If the opposite binary state is stored in the storage cell, the bit line may not be discharged and the output of the sense gate may not change, making the time delays unnecessary. However, since the state of the storage cell is not known until reading the gate after time T3, the same timing delays may be observed regardless of the state of the storage cell.)

Graphs B) and C) shown the signals on the selected word line and the offset line, respectively. In FIG. 4, the word line is asserted at T1 by driving it from low to high, and at essentially the same time, the offset line is deasserted by driving it from high to low. The coupling effects from each of these two signals on the bit line are shown in the next two graphs. Beginning at time T1, the coupling effect of the word line assertion, when considered alone, causes an increase in the voltage on the bit line, causing the upward bulge shown immediately after T1 in graph D). Since the discharge is now starting from a higher level, the voltage on the bit line does not reach the input threshold of the sense gate until time T4, which is later than T3. The coupling effect of the offset line deassertion, when considered alone, causes an immediate decrease in the voltage on the bit line, as shown in graph E). The discharge through the selected memory cell therefore starts from a lower voltage level, and reaches the input threshold of the sense gate at time T2, which is sooner than T3. If the coupling effects of the word line assertion and the offset line deassertion are balanced, they cancel each other out as shown in graph F) and the input threshold of the sense gate is reached at T3. Even if they are not exactly balanced, the coupling effect of the offset line deassertion may approximately cancel the coupling effect of the word line assertion, so that the combined result is that the input threshold of the sense gate is reached at approximately T3. Thus the use of an offset line, deasserted each time one of the associated word lines is asserted, may reduce or eliminate the delay in discharging the bit line that is caused by the coupling effect of the asserted word line.

Figure 5:
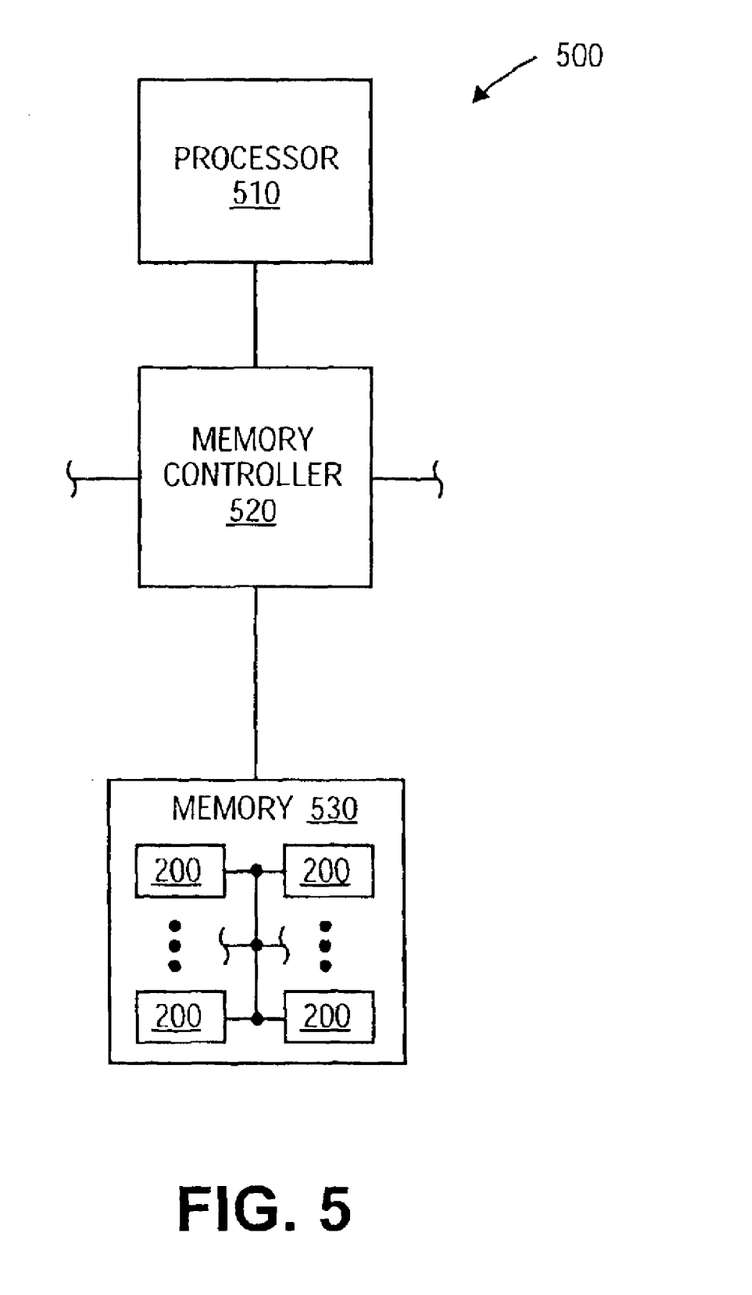
FIG. 5 shows a system having multiple memories, according to one embodiment of the invention.

FIG. 5 shows a system having multiple memories, according to one embodiment of the invention. System 500 comprises a processor 510, a memory controller 520, and a memory device 530, and may also comprise multiple other devices not shown. In the illustrated embodiment, memory device 530 may comprise multiple memory portions 200, as previously described for FIG. 2, as well as other memory elements not shown. The memory portions 200 may be available for read and write operations by processor 510, and well as read and write operations from other devices in system 500. In some embodiments, portions of memory 200 (e.g., control logic 220 of FIG. 2) may be located in memory controller 520. Memories as described herein may also be used in various other places in the system, for example, in individual input-output controllers, in individual input-output devices, as buffer storage, as cache memory in the processor, etc.

The foregoing description is intended to be illustrative and not limiting. Variations will occur to those of skill in the art. Those variations are intended to be included in the various embodiments of the invention, which are limited only by the spirit and scope of the appended claims.

What is claimed is:

1. An apparatus comprising:
   a storage cell;
   a first transistor coupled between the storage cell and a first line to discharge a voltage on the first line resultant to a particular value being stored in the storage cell, the first transistor having a first gate coupled to a second line;
   a second transistor coupled between a reference voltage and the first line and having a second gate coupled to an third line; and
   control logic to assert a first signal on the second line, the assertion of the first signal to cause a first capacitive coupling onto the first line, the control logic further to deassert second signal on the third line at approximately a same time as the assertion, the deassertion of the second signal to cause a second capacitive coupling onto the first line to substantially cancel the first capacitive coupling.

2. The apparatus of claim 1, wherein:
   the first capacitive coupling onto the first line and the second capacitive coupling onto the first line substantially cancel each other.

3. The apparatus of claim 1, wherein:
   the control logic is to assert the first signal from low to high and is to deassert the second signal from high to low.

4. The apparatus of claim 3, wherein:
   the control logic is to cause the first capacitive coupling in a direction to decrease the voltage on the first line; and
   the control logic is to cause the second capacitive coupling in a direction to decrease the voltage on the first line.

5. The apparatus of claim 1, further comprising:
   a sense gate coupled to the first line in a single-ended sensing arrangement.

6. The apparatus of claim 1, wherein:
   the storage cell is part of a static random access memory.

7. The apparatus of claim 1, wherein:
   the first transistor is an NMOS transistor.

8. The apparatus of claim 1, wherein:
   the second transistor is an NMOS transistor.

9. An apparatus comprising:
   a memory device comprising a plurality of memory cells connected electrically in a matrix arrangement to a plurality of sense lines and a plurality of select lines;
   pre-charge logic coupled to the plurality of sense lines to pre-charge a particular voltage on a particular one of the plurality of sense lines;
   control logic coupled to the plurality of select lines to assert a first signal on a particular one of the plurality of select lines; and
   an offset line coupled to the control logic, the control logic to deassert a second signal on the offset line to substantially cancel capacitive coupling onto the sense line from the assertion.

10. The apparatus of claim 9, further comprising:
    a sense gate coupled to the particular one of the plurality of sense lines to detect a stored state in a particular one of the plurality of memory cells connected to the particular one of the plurality of sense lines and connected to the particular one of the plurality of select lines.

11. The apparatus of claim 10, wherein:
    the particular one of the plurality of sense lines and the sense gate form portion of a single-ended sensing arrangement.

12. The apparatus of claim 11, wherein:
    the single-ended sensing arrangement is to detect a binary state stored in the particular one of the plurality of memory cells.

13. The apparatus of claim 9, wherein:
    the plurality of memory cells comprise a plurality of static random access memory cells.

14. The apparatus of claim 9, wherein:
    the assertion of the first signal comprises a low-to-high voltage transition; and
    the deassertion of the second signal comprises a high-to-low voltage transition.

15. A method comprising:
    asserting a signal on a select line coupled to a gate of a transistor to apply a voltage signal representing a bit value stored in a storage cell onto a sense line coupled to the transistor; and
    deasserting a signal on an offset line at approximately a same time as said asserting the signal on the select line to substantially cancel capacitive coupling from the select line to the sense line.

16. The method of claim 15, further comprising:
    coupling the storage cell to the sense line through the transistor resultant to said asserting.

17. The method of claim 15, wherein:
    said deasserting comprises deasserting a signal on the offset line to a binary state opposite a binary state of the asserted signal on the select line.

18. The method of claim 17, wherein:
    said asserting comprises changing a voltage level on the select line from low to high; and
    said deasserting comprises changing a voltage level on the offset line from high to low.

19. The method of claim 17, further comprising:
    turning off a second transistor coupled between the sense line and a reference voltage resultant to said deasserting.

20. The method of claim 15, further comprising:
    pre-charging the sense line to a predetermined voltage prior to said asserting and said deasserting.

21. A system comprising:

a processor;

a memory device coupled to the processor and comprising
- a plurality of memory cells connected electrically in a matrix arrangement to a plurality of sense lines and a plurality of select lines;
- pre-charge logic coupled to the plurality of sense lines to pre-charge a particular voltage on a particular one of the plurality of sense lines;
- control logic coupled to the plurality of select lines to assert a first signal on a particular one of the plurality of select lines; and
- an offset line coupled to the control logic, the control logic to deassert a second signal on the offset line to substantially cancel capacitive coupling onto the sense line from the assertion.

22. The system of claim 21, further comprising:

a sense gate coupled to the particular one of the plurality of sense lines to detect a stored state in a particular one of the plurality of memory cells connected to the particular one of the plurality of sense lines and connected to the particular one of the plurality of select lines.

23. The system of claim 22, wherein:

the particular one of the plurality of sense lines and the sense gate form portion of a single-ended sensing arrangement.

24. The system of claim 21, wherein:

the plurality of memory cells comprise a plurality of static random access memory cells.

25. The system of claim 21, wherein:

the assertion of the first signal comprises a low-to-high voltage transition; and the deassertion of the second signal comprises a high-to-low voltage transition.

* * * * *

UNITED STATES PATENT AND TRADEMARK OFFICE
CERTIFICATE OF CORRECTION

PATENT NO. : 6,879,531 B2
DATED : April 12, 2005
INVENTOR(S) : Somasekhar et al.

It is certified that error appears in the above-identified patent and that said Letters Patent is hereby corrected as shown below:

Column 8,
Line 25, after "form", insert -- a --.

Signed and Sealed this

Twenty-eighth Day of June, 2005

JON W. DUDAS
*Director of the United States Patent and Trademark Office*